(12) United States Patent
Kim

(10) Patent No.: US 11,435,815 B2
(45) Date of Patent: Sep. 6, 2022

(54) SEMICONDUCTOR DEVICES PROVIDING A POWER-DOWN MODE AND METHODS OF CONTROLLING THE POWER-DOWN MODE USING THE SEMICONDUCTOR DEVICES

(71) Applicant: SK hynix Inc., Icheon-si (KR)

(72) Inventor: Woongrae Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 303 days.

(21) Appl. No.: 16/215,332

(22) Filed: Dec. 10, 2018

(65) Prior Publication Data

US 2020/0097064 A1    Mar. 26, 2020

(30) Foreign Application Priority Data

Sep. 20, 2018    (KR) .......................... 10-2018-0113300

(51) Int. Cl.
| | |
|---|---|
| *G06F 1/3296* | (2019.01) |
| *G06F 1/3206* | (2019.01) |
| *G11C 5/14* | (2006.01) |
| *G11C 7/20* | (2006.01) |
| *G06F 1/3234* | (2019.01) |

(52) U.S. Cl.
CPC .................... *G06F 1/3296* (2013.01)

(58) Field of Classification Search
CPC ..... G06F 1/3296; G06F 1/3203; G06F 1/3275
See application file for complete search history.

(56) References Cited

U.S. PATENT DOCUMENTS

| | | | | |
|---|---|---|---|---|
| 6,266,776 | B1* | 7/2001 | Sakai ................... | G06F 1/3203 713/300 |
| 7,093,115 | B2* | 8/2006 | Poisner ................. | G06F 9/4403 713/1 |
| 8,639,874 | B2 | 1/2014 | Maule et al. | |
| 2001/0043493 | A1* | 11/2001 | Fujioka ................. | G06F 1/3203 365/189.09 |
| 2003/0223271 | A1* | 12/2003 | Byeon .................... | G11C 16/30 365/185.18 |
| 2005/0117402 | A1* | 6/2005 | Kim ......................... | G11C 8/06 365/189.05 |
| 2005/0283572 | A1* | 12/2005 | Ishihara ................ | G06F 1/3203 711/118 |
| 2006/0082316 | A1* | 4/2006 | Yahagi ................ | F02N 11/0862 315/73 |
| 2009/0292934 | A1* | 11/2009 | Esliger .................. | G06F 1/3287 713/323 |

FOREIGN PATENT DOCUMENTS

KR    1020170127948 A    11/2017

* cited by examiner

*Primary Examiner* — Jaweed A Abbaszadeh
*Assistant Examiner* — Gayathri Sampath
(74) *Attorney, Agent, or Firm* — William Park & Associates Ltd.

(57) ABSTRACT

A semiconductor device includes a power switch control signal generation circuit. The power switch control signal generation circuit configured to generate a power switch control signal for controlling supply of a power supply voltage based on a reset operation and a power-down mode.

10 Claims, 11 Drawing Sheets

12

SEMICONDUCTOR DEVICES PROVIDING A POWER-DOWN MODE AND METHODS OF CONTROLLING THE POWER-DOWN MODE USING THE SEMICONDUCTOR DEVICES

CROSS-REFERENCE TO RELATED APPLICATION

The present application claims priority under 35 U.S.C 119(a) to Korean Application No. 10-2018-0113300, filed on Sep. 20, 2018, which is incorporated herein by reference in its entirety.

BACKGROUND

1. Technical Field

Embodiments of the present disclosure generally relate to semiconductor devices and methods of controlling the semiconductor devices and, more particularly, to semiconductor devices providing a power-down mode and methods of controlling the power-down mode using the semiconductor devices.

2. Related Art

Semiconductor devices, for example, dynamic random access memory (DRAM) devices have been designed to operate at a high speed with low power consumption and large cell capacitance. Thus, most semiconductor devices may be designed to provide a power-down mode that minimizes a driving current when data are not transmitted.

In the power-down mode, the semiconductor devices may interrupt the input of a power supply voltage or a clock signal to reduce the power consumption thereof.

SUMMARY

According to an embodiment, a semiconductor device includes an operation period signal generation circuit and a power switch control signal generation circuit. The operation period signal generation circuit generates an operation period signal and an inverted operation period signal based on a power-down entry signal and a reset signal. The power switch control signal generation circuit generates a power switch control signal for controlling supply of a power supply voltage based on the reset signal and the inverted operation period signal when a power-down mode is activated.

According to an embodiment, a semiconductor device includes a power switch control signal generation circuit and a power-down control signal generation circuit. The power switch control signal generation circuit generates a power switch control signal for maintaining supply of a power supply voltage when a reset operation is performed to activate a power-down mode. The power-down control signal generation circuit inactivates a buffer circuit in the power-down mode and generates a power-down control signal for activating the buffer circuit when the power-down mode terminates.

According to an embodiment, there is provided a method of controlling a power-down mode of semiconductor devices. The method includes inactivating a buffer circuit and maintaining supply of a power supply voltage to a logic circuit, when a reset operation is performed to activate the power-down mode. The method also includes activating the buffer circuit when the power-down mode terminates.

According to an embodiment, a semiconductor device includes a power switch control signal generation circuit configured to generate a power switch control signal when a reset operation is performed to activate a first power-down mode; and a operation circuit configured to receive the power switch control signal and to supply the power supply voltage when the power switch control signal is a first logic level and to interrupt the power supply voltage when the power switch control signal is a second logic level.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Figure 1:
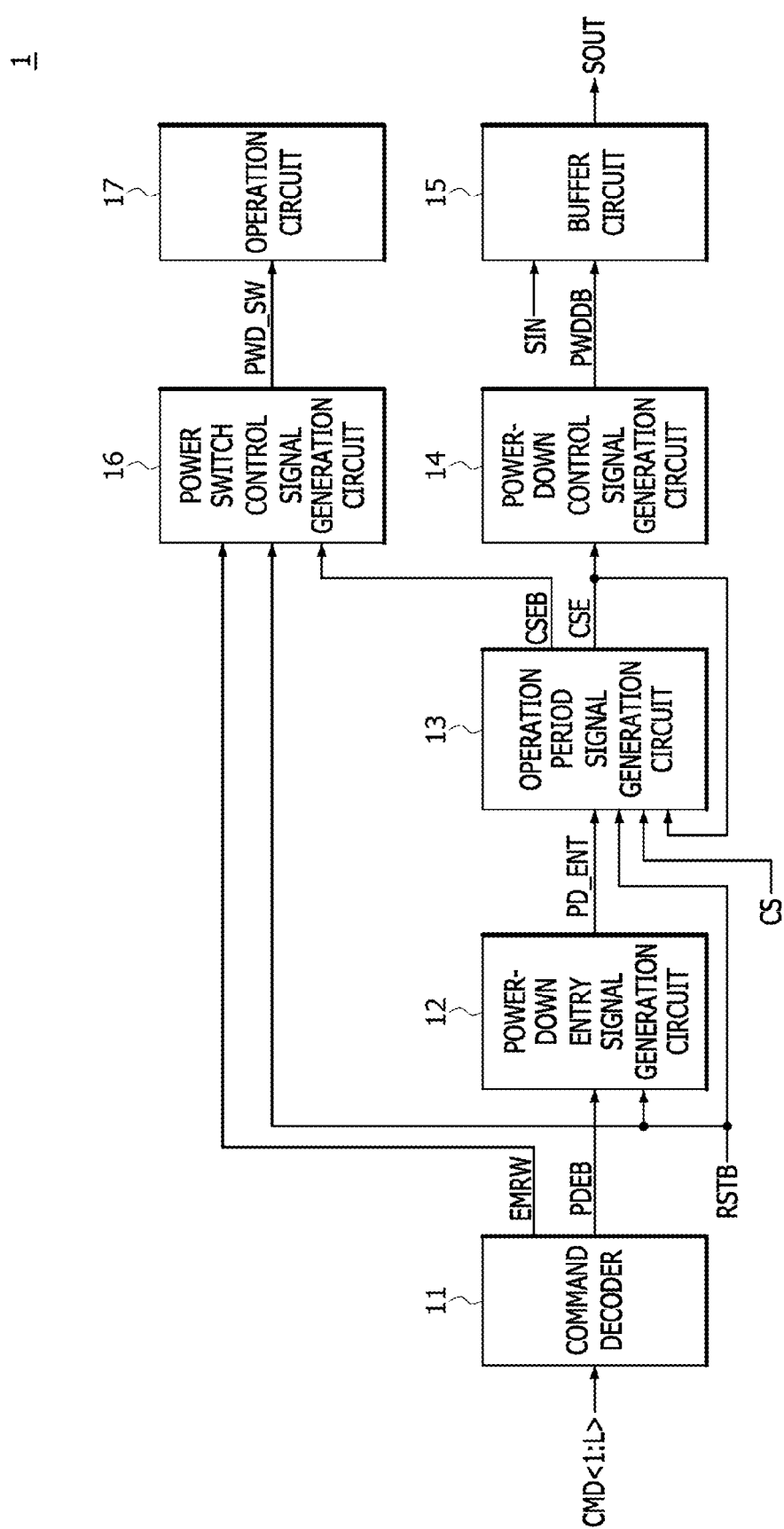
FIG. 1 is a block diagram illustrating a semiconductor device according to an embodiment of the present disclosure.

As illustrated in FIG. 1, a semiconductor device 1 according to an embodiment may include a command decoder 11, a power-down entry signal generation circuit 12, an operation period signal generation circuit 13, a power-down control signal generation circuit 14, a buffer circuit 15, a power switch control signal generation circuit 16, and an operation circuit 17.

The command decoder 11 may decode a command CMD<1:L> to generate a mode register write command EMRW and a power-down command PDEB. The mode register write command EMRW may be generated to perform a mode register write operation. The power-down command PDEB may be generated to put the semiconductor device 1 in a power-down mode. The mode register write command EMRW may be generated using different ways according to the embodiments. For example, the mode register write command EMRW may be generated to include a pulse having a logic "high" level. A logic level combination of the command CMD<1:L> for generating the mode register write command EMRW may be set to be different according to the embodiments. The power-down command PDEB may be generated using different ways according to the embodiments. For example, the power-down command PDEB may be generated to include a pulse having a logic "low" level. A logic level combination of the command CMD<1:L> for generating the power-down command PDEB may be set to be different according to the embodiments. The number 'L' of bits included in the command CMD<1:L> may be set to be different according to the embodiments (where, 'L' denotes a natural number).

The power-down entry signal generation circuit 12 may generate a power-down entry signal PD_ENT based on the power-down command PDEB and a reset signal RSTB. The power-down entry signal generation circuit 12 may generate the power-down entry signal PD_ENT if the power-down command PDEB is generated to put the semiconductor device 1 into the power-down mode or the reset signal RSTB is generated to perform a reset operation. The reset operation may be performed to execute an initialization operation for setting logic levels of internal nodes in the semiconductor device 1 at an initial stage in which a power supply voltage VDD is firstly applied to the semiconductor device 1. The reset signal RSTB may be generated using different ways according to the embodiments. For example, the reset signal RSTB may be generated to include a pulse having a logic "low" level. The power-down entry signal PD_ENT may be generated for activation of the power-down mode or for execution of the reset operation. The power-down entry signal PD_ENT may be generated using different ways according to the embodiments. For example, the power-down entry signal PD_ENT may be generated to include a pulse having a logic "high" level. A configuration and an operation of the power-down entry signal generation circuit 12 will be described below with reference to FIG. 2 later.

The operation period signal generation circuit 13 may generate an operation period signal CSE and an inverted operation period signal CSEB based on the power-down entry signal PD_ENT, the reset signal RSTB, a chip selection signal CS, and the operation period signal CSE. The operation period signal generation circuit 13 may generate the operation period signal CSE if the power-down entry signal PD_ENT is generated in the power-down mode. The operation period signal generation circuit 13 may generate the operation period signal CSE having a first logic level and the inverted operation period signal CSEB having a second logic level if the reset signal RSTB is generated to perform the reset operation. The operation period signal generation circuit 13 may generate the operation period signal CSE having a second logic level and the inverted operation period signal CSEB having a first logic level if the chip selection signal CS is toggled to exit the power-down mode. The chip selection signal CS may be provided by a memory controller (1002 of FIG. 11) which is separate from the semiconductor device 1. The chip selection signal CS may be generated if a chip including the semiconductor device 1 is selected. In an embodiment, the first logic level of the operation period signal CSE may be set as a logic "low" level, and the second logic level of the operation period signal CSE may be set as a logic "high" level. However, in some other embodiments, the first and second logic levels of the operation period signal CSE may be set differently. A configuration and an operation of the operation period signal generation circuit 13 will be described below with reference to FIG. 3 later.

The power-down control signal generation circuit 14 may buffer the operation period signal CSE to generate a power-down control signal PWDDB. The power-down control signal PWDDB may be generated to have the same logic level as the operation period signal CSE. In some embodiments, the power-down control signal PWDDB may be generated to have a logic level which is different from a logic level of the operation period signal CSE. A configuration and an operation of the power-down control signal generation circuit 14 will be described below with reference to FIG. 4 later.

The buffer circuit 15 may buffer an input signal SIN based on the power-down control signal PWDDB to generate an output signal SOUT. The buffer circuit 15 may activate an operation that buffers the input signal SIN if the power-down control signal PWDDB has a second logic level. The buffer circuit 15 may inactivate the operation that buffers the input signal SIN if the power-down control signal PWDDB has a first logic level. In an embodiment, the first logic level of the power-down control signal PWDDB may be set as a logic "low" level, and the second logic level of the power-down control signal PWDDB may be set as a logic "high" level. However, in some other embodiments, the first and second logic levels of the power-down control signal PWDDB may be set differently. A configuration and an operation of the buffer circuit 15 will be described below with reference to FIG. 5 later. (PSL of FIG. 7)

The power switch control signal generation circuit 16 may generate a power switch control signal PWD_SW based on the mode register write command EMRW, the reset signal RSTB, and the inverted operation period signal CSEB. The power switch control signal generation circuit 16 may generate the power switch control signal PWD_SW having the second logic level to supply the power supply voltage VDD to a power line (PSL of FIG. 7) if the reset signal RSTB having the first logic level for performing the reset operation is generated. The power switch control signal generation circuit 16 may generate the power switch control signal PWD_SW having the first logic level to interrupt the supply of the power supply voltage VDD to the power line (PSL of FIG. 7) if the semiconductor device 1 enters the power-down mode by the power-down command PDEB after the mode register write command EMRW is inputted and the inverted operation period signal CSEB has the second logic level. The power switch control signal generation circuit 16 may generate the power switch control signal PWD_SW to supply the power supply voltage VDD to a power line (PSL of FIG. 7) if the reset signal RSTB for performing the reset operation is generated, and may generate the power switch control signal PWD_SW to interrupt the supply of the power supply voltage VDD to the power line (PSL of FIG. 7) if the semiconductor device 1 enters the power-down mode by the power-down command PDEB after the mode register write command EMRW is inputted. Thus, an enough period for performing the reset operation may be obtained. A configuration and an operation of the power switch control signal generation circuit 16 will be described below with reference to FIG. 6 later.

The operation circuit 17 may control whether the power supply voltage VDD is supplied to a power line (PSL of FIG. 7), based on the power switch control signal PWD_SW. The operation circuit 17 may interrupt the supply of the power supply voltage VDD to the power line (PSL of FIG. 7), if the power switch control signal PWD_SW has the first logic level. The operation circuit 17 may supply the power supply voltage VDD to the power line (PSL of FIG. 7) if the power switch control signal PWD_SW has the second logic level.

A configuration and an operation of the operation circuit 17 will be described below with reference to FIG. 7 later.

Figure 2:
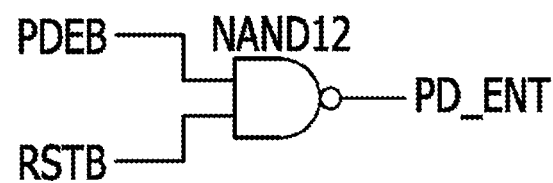
FIG. 2 is a circuit diagram illustrating an example of a power-down entry signal generation circuit included in the semiconductor device of FIG. 1.

Referring to FIG. 2, the power-down entry signal generation circuit 12 may include a NAND gate NAND12. The NAND gate NAND12 may perform a logical NAND operation of the power-down command PDEB and the reset signal RSTB. The power-down entry signal generation circuit 12 may generate the power-down entry signal PD_ENT having a logic "high" level if the power-down command PDEB including a pulse having a logic "low" level is generated to activate the power-down mode or the reset signal RSTB including a pulse having a logic "low" level is generated to perform the reset operation.

Figure 3:
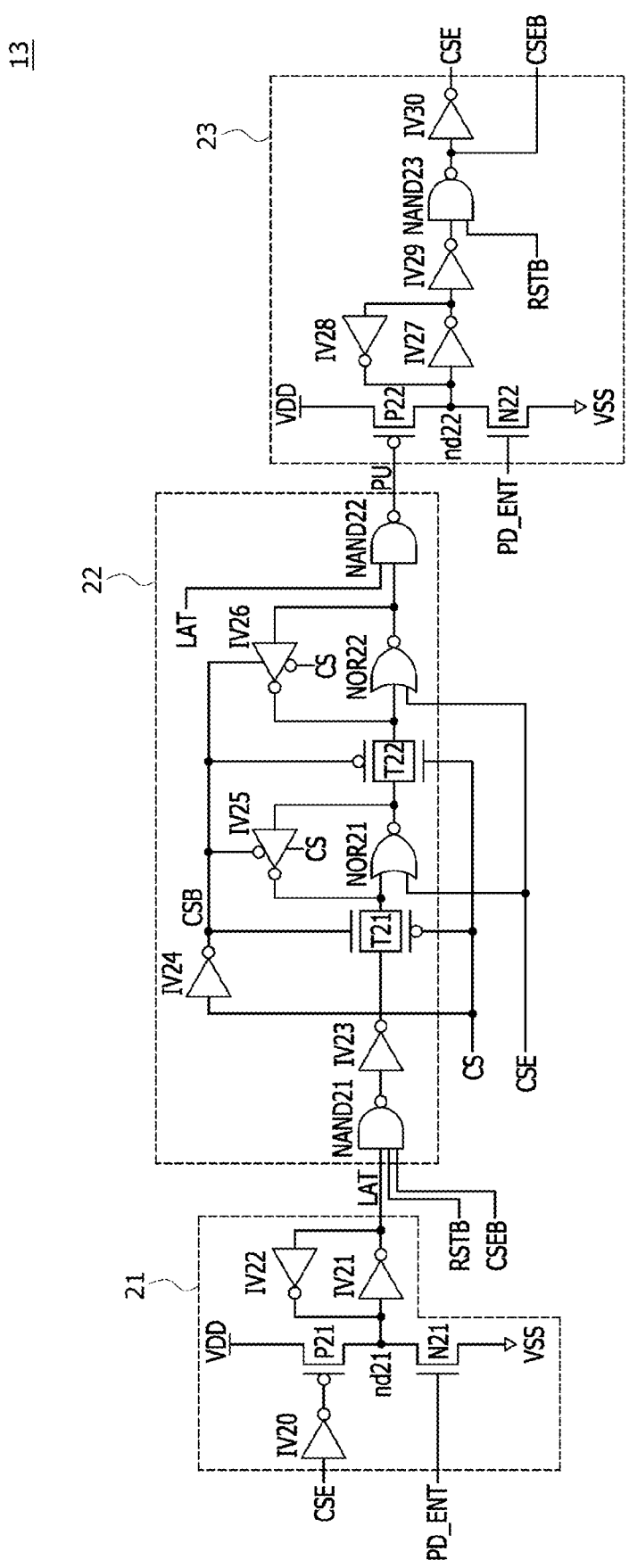
FIG. 3 is a circuit diagram illustrating an example of an operation period signal generation circuit included in the semiconductor device of FIG. 1.

Referring to FIG. 3, the operation period signal generation circuit 13 may include a latch signal generation circuit 21, a pull-up signal generation circuit 22, and an operation period signal output circuit 23.

The latch signal generation circuit 21 may include inverters IV20, IV21, and IV22, an n-channel metal oxide semiconductor (NMOS) transistor N21, and a p-channel metal oxide semiconductor (PMOS) transistor P21. The inverter IV20 may inversely buffer the operation period signal CSE to output the inversely buffered signal of the operation period signal CSE. The NMOS transistor N21 may be coupled between a node nd21 and a ground voltage VSS terminal and may be turned on to drive the node nd21 to the ground voltage VSS if the power-down entry signal PD_ENT is generated. The PMOS transistor P21 may be coupled between a power supply voltage VDD terminal and the node nd21 and may be turned on to drive the node nd21 to the power supply voltage VDD if an output signal of the inverter IV20 has a logic "low" level. The inverter IV21 may inversely buffer a signal of the node nd21 to output the inversely buffered signal of the signal of the node nd21 as a latch signal LAT. The inverter IV22 may inversely buffer the latch signal LAT to output the inversely buffered signal of the latch signal LAT to the node nd21.

The latch signal generation circuit 21 may generate the latch signal LAT based on the power-down entry signal PD_ENT and the operation period signal CSE. The latch signal generation circuit 21 may generate the latch signal LAT having a logic "high" level if the power-down entry signal PD_ENT is generated to have a logic "high" level in the power-down mode. The latch signal generation circuit 21 may generate the latch signal LAT having a logic "low" level if the operation period signal CSE is generated to have a logic "high" level out of the power-down mode.

The pull-up signal generation circuit 22 may include NAND gates NAND21 and NAND22, inverters IV23~IV26, NOR gates NOR21 and NOR22, and transfer gates T21 and T22. The NAND gate NAND21 may receive the latch signal LAT, the reset signal RSTB, and the inverted operation period signal CSEB to perform a logic NAND operation of the latch signal LAT, the reset signal RSTB, and the inverted operation period signal CSEB. The inverter IV23 may inversely buffer an output signal of the NAND gate NAND21 to output the inversely buffered signal of the output signal of the NAND gate NAND21. The inverter IV24 may inversely buffer the chip selection signal CS to output the inversely buffered signal of the chip selection signal CS as an inverted chip selection signal CSB. The transfer gate T21 may be turned on to transmit an output signal of the inverter IV23 to an input node of the NOR gate NOR21 if the chip selection signal CS has a logic "low" level. The NOR gate NOR21 may perform a logical NOR operation of an output signal of the transfer gate T21 and the operation period signal CSE. The inverter IV25 may inversely buffer an output signal of the NOR gate NOR21 if the chip selection signal CS has a logic "high" level, and an output signal of the inverter IV25 may be fed back into an input node of the NOR gate NOR21 which is connected to an output node of the transfer gate T21. The transfer gate T22 may be turned on to transmit an output signal of the NOR gate NOR21 to an input node of the NOR gate NOR22 if the chip selection signal CS has a logic "high" level. The NOR gate NOR22 may perform a logical NOR operation of an output signal of the transfer gate T22 and the operation period signal CSE. The inverter IV26 may inversely buffer an output signal of the NOR gate NOR22 if the chip selection signal CS has a logic "low" level, and an output signal of the inverter IV26 may be fed back into an input node of the NOR gate NOR22 which is connected to an output node of the transfer gate T22. The NAND gate NAND22 may perform a logical NAND operation of the latch signal LAT and an output signal of the NOR gate NOR22 to generate a pull-up signal PU.

The pull-up signal generation circuit 22 may generate the pull-up signal PU having a logic "low" level if a level transition of the chip selection signal CS occurs from a logic "low" level into a logic "high" level after the reset signal RSTB and the inverted operation period signal CSEB are set to have a logic "high" level while the latch signal LAT has a logic "high" level in the power-down mode.

The operation period signal output circuit 23 may include a PMOS transistor P22, an NMOS transistor N22, inverters IV27~IV30, and a NAND gate NAND23. The NMOS transistor N22 may be coupled between a node nd22 and the ground voltage VSS terminal and may be turned on to drive the node nd22 to the ground voltage VSS if the power-down entry signal PD_ENT is generated. The PMOS transistor P22 may be coupled between the power supply voltage VDD terminal and the node nd22 and may be turned on to drive the node nd22 to the power supply voltage VDD if the pull-up signal PU has a logic "low" level. The inverter IV27 may inversely buffer a signal of the node nd22 to output the inversely buffered signal of the signal of the node nd22. The inverter IV28 may inversely buffer an output signal of the inverter IV27 to output the inversely buffered signal of the output signal of the inverter IV27 to the node nd22. The inverter IV29 may inversely buffer an output signal of the inverter IV27 to output the inversely buffered signal of the output signal of the inverter IV27. The NAND gate NAND23 may perform a logical NAND operation of an output signal of the inverter IV29 and the reset signal RSTB to generate the inverted operation period signal CSEB. The inverter IV30 may inversely buffer the inverted operation period signal CSEB to generate the operation period signal CSE.

The operation period signal output circuit 23 may generate the inverted operation period signal CSEB having a logic "high" level and the operation period signal CSE having a logic "low" level if the power-down entry signal PD_ENT is generated to have a logic "high" level in the power-down mode. The operation period signal output circuit 23 may generate the inverted operation period signal CSEB having a logic "low" level and the operation period signal CSE having a logic "high" level if the pull-up signal PU is generated to have a logic "low" level out of the power-down mode.

Figure 4:
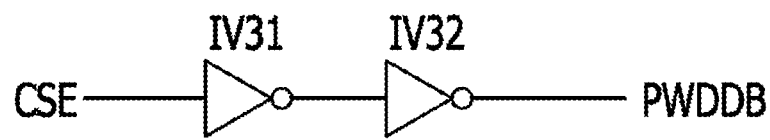
FIG. 4 is a circuit diagram illustrating an example of a power-down control signal generation circuit included in the semiconductor device of FIG. 1.

Referring to FIG. 4, the power-down control signal generation circuit 14 may include inverters IV31 and IV32. The inverter IV31 may inversely buffer the operation period signal CSE to output the inversely buffered signal of the operation period signal CSE. The inverter IV32 may inversely buffer an output signal of the inverter IV31 to output the inversely buffered signal of the output signal of the inverter IV31. The power-down control signal generation circuit 14 may buffer the operation period signal CSE to generate the power-down control signal PWDDB. The power-down control signal PWDDB may be generated to have the same logic level as the operation period signal CSE.

Figure 5:
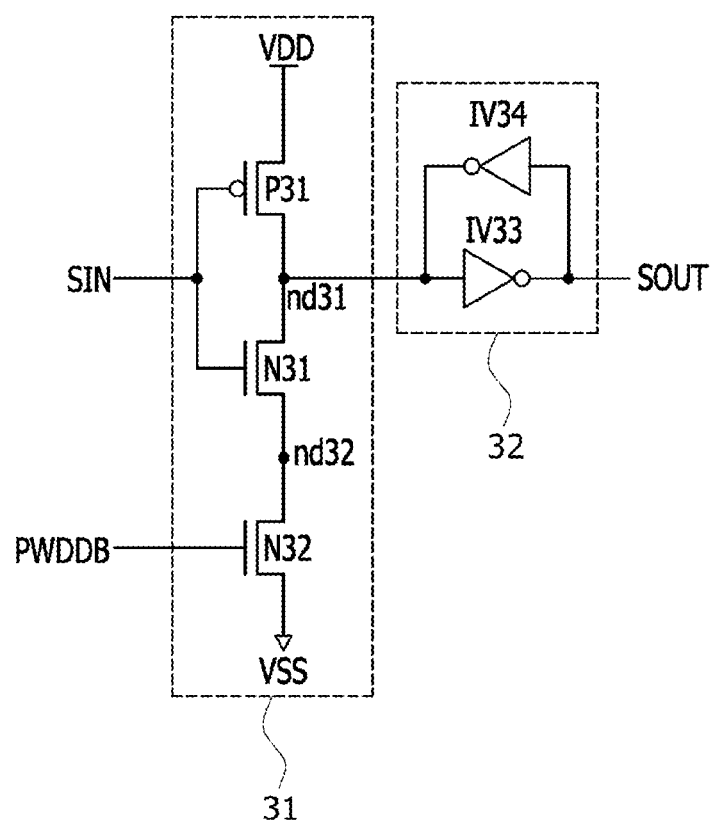
FIG. 5 is a circuit diagram illustrating an example of a buffer circuit included in the semiconductor device of FIG. 1.

Referring to FIG. 5, the buffer circuit 15 may include a selection/input circuit 31 and an output latch circuit 32. The selection/input circuit 31 may include a PMOS transistor P31 and NMOS transistors N31 and N32. The PMOS transistor P31 may be coupled between the power supply voltage VDD terminal and a node nd31 and may be turned on to drive the node nd31 to the power supply voltage VDD if the input signal SIN having a logic "low" level is inputted to a gate of the PMOS transistor P31. The NMOS transistor N31 may be coupled between the node nd31 and a node nd32 and may be turned on if the input signal SIN having a logic "high" level is inputted to a gate of the NMOS transistor N31. The NMOS transistor N32 may be coupled between the node nd32 and the ground voltage VSS terminal and may be turned on to drive the node nd32 to the ground voltage VSS if the power-down control signal PWDDB having a logic "high" level is inputted to a gate of the NMOS transistor N32. The output latch circuit 32 may include inverters IV33 and IV34. The inverter IV33 may inversely buffer a signal of the node nd31 to output the inversely buffered signal of the signal of the node nd31 as the output signal SOUT. The inverter IV34 may inversely buffer the output signal SOUT to output the inversely buffered signal of the output signal SOUT to the node nd31.

The buffer circuit 15 may receive the power-down control signal PWDDB having a logic "high" level if the semiconductor device 1 is out of the power-down mode. The buffer circuit 15 may activate an operation buffering the input signal SIN to generate the output signal SOUT if the power-down control signal PWDDB has a logic "high" level. The buffer circuit 15 may receive the power-down control signal PWDDB having a logic "low" level if the semiconductor device 1 is in the power-down mode. The buffer circuit 15 may inactivate the operation buffering the input signal SIN if the power-down control signal PWDDB has a logic "low" level.

Figure 6:
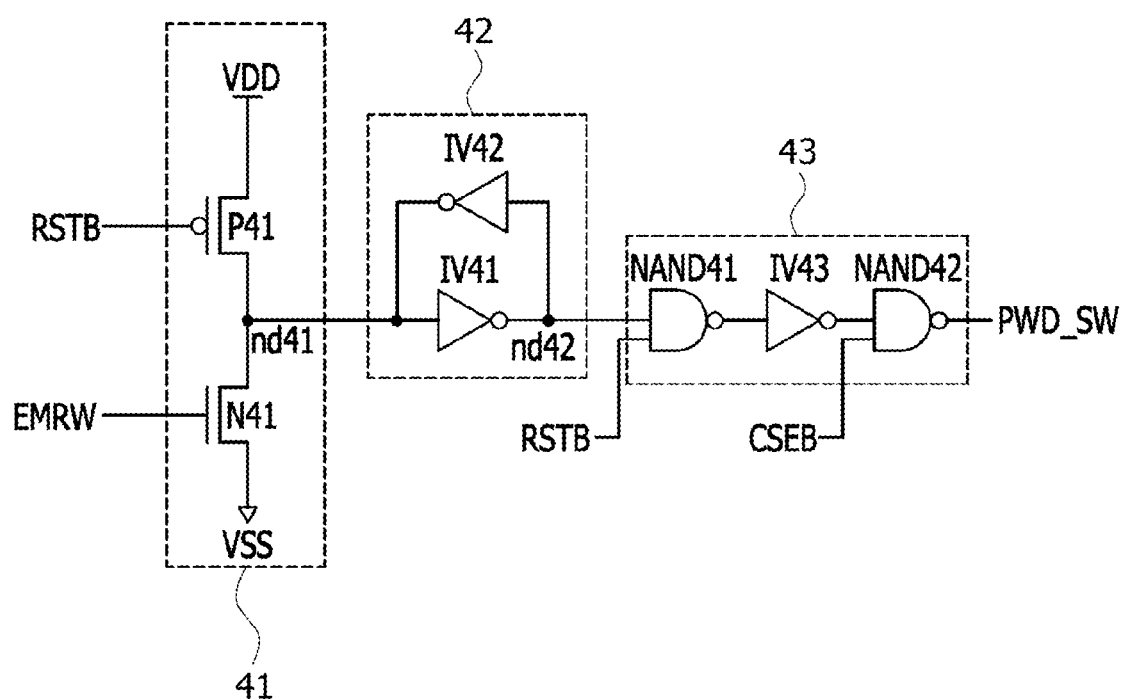
FIG. 6 is a circuit diagram illustrating an example of a power switch control signal generation circuit included in the semiconductor device of FIG. 1.

Referring to FIG. 6, the power switch control signal generation circuit 16 may include an input drive circuit 41, a latch circuit 42, and a power switch control signal output circuit 43. The input drive circuit 41 may include a PMOS transistor P41 and an NMOS transistor N41. The PMOS transistor P41 may be coupled between the power supply voltage VDD terminal and a node nd41 and may be turned on to drive the node nd41 to the power supply voltage VDD if the reset signal RSTB having a logic "low" level is inputted to a gate of the PMOS transistor P41 to perform the reset operation. The NMOS transistor N41 may be coupled between the node nd41 and the ground voltage VSS terminal and may be turned on to drive the node nd41 to the ground voltage VSS if the mode register write command EMRW having a logic "high" level is inputted to a gate of the NMOS transistor N41 to perform the mode register write operation. The latch circuit 42 may include inverters IV41 and IV42. The inverter IV41 may inversely buffer a signal of the node nd41 to output the inversely buffered signal of the signal of the node nd41 to a node nd42. The inverter IV42 may inversely buffer a signal of the node nd42 to output the inversely buffered signal of the signal of the node nd42 to the node nd41. The power switch control signal output circuit 43 may include NAND gates NAND41 and NAND42 and an inverter IV43. The NAND gate NAND41 may perform a logical NAND operation of a signal of the node nd42 and the reset signal RSTB. The inverter IV43 may inversely buffer an output signal of the NAND gate NAND41 to output the inversely buffered signal of the output signal of the NAND gate NAND41. The NAND gate NAND42 may perform a logical NAND operation of an output signal of the inverter IV43 and the inverted operation period signal CSEB to generate the power switch control signal PWD_SW.

The power switch control signal generation circuit 16 may generate the power switch control signal PWD_SW having a logic "high" level to supply the power supply voltage VDD to a power line (PSL of FIG. 7) if the reset signal RSTB having a logic "low" level for performing the reset operation is generated. The power switch control signal generation circuit 16 may generate the power switch control signal PWD_SW having the logic "low" level to interrupt the supply of the power supply voltage VDD to the power line (PSL of FIG. 7) if the semiconductor device 1 enters the power-down mode by the power-down command PDEB after the mode register write command EMRW is inputted and the inverted operation period signal CSEB has the second logic level. The power switch control signal generation circuit 16 may generate the power switch control signal PWD_SW to supply the power supply voltage VDD to a power line (PSL of FIG. 7) if the reset signal RSTB for performing the reset operation is generated, and may generate the power switch control signal PWD_SW to interrupt the supply of the power supply voltage VDD to the power line (PSL of FIG. 7) if the semiconductor device 1 enters the power-down mode by the power-down command PDEB after the mode register write command EMRW is inputted. Thus, an enough period for performing the reset operation may be obtained.

Figure 7:
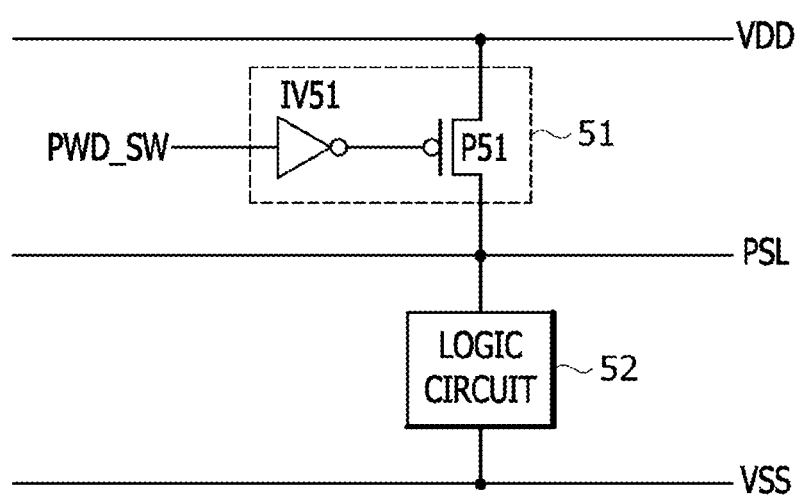
FIG. 7 is a circuit diagram illustrating an example of an operation circuit included in the semiconductor device of FIG. 1.

Referring to FIG. 7, the operation circuit 17 may include a power switch circuit 51 and a logic circuit 52. The power switch circuit 51 may include an inverter IV51 and a PMOS transistor P51. The inverter IV51 may inversely buffer the power switch control signal PWD_SW to output the inversely buffered signal of the power switch control signal PWD_SW. The inverter IV51 may output the inversely buffered signal of the power signal control signal PWD_SW to a gate of the PMOS transistor P51. The PMOS transistor P51 may be coupled between the power supply voltage VDD terminal and the power line PSL and may be turned on to supply the power supply voltage VDD to the power line PSL if the power switch control signal PWD_SW having a logic "high" level is inputted to the power switch circuit 51. The logic circuit 52 may be coupled between the power line PSL and the ground voltage VSS terminal and may perform an internal operation necessary for the reset operation if the power supply voltage VDD is supplied to logic circuit 52 through the power line PSL.

The operation circuit 17 may interrupt the supply of the power supply voltage VDD to the power line PSL, if the power switch control signal PWD_SW has a logic "low" level. The operation circuit 17 may supply the power supply voltage VDD to the power line PSL if the power switch control signal PWD_SW has a logic "high" level.

An operation of the semiconductor device 1 having the aforementioned configuration will be described hereinafter with reference to FIGS. 8 and 9.

Figure 8:
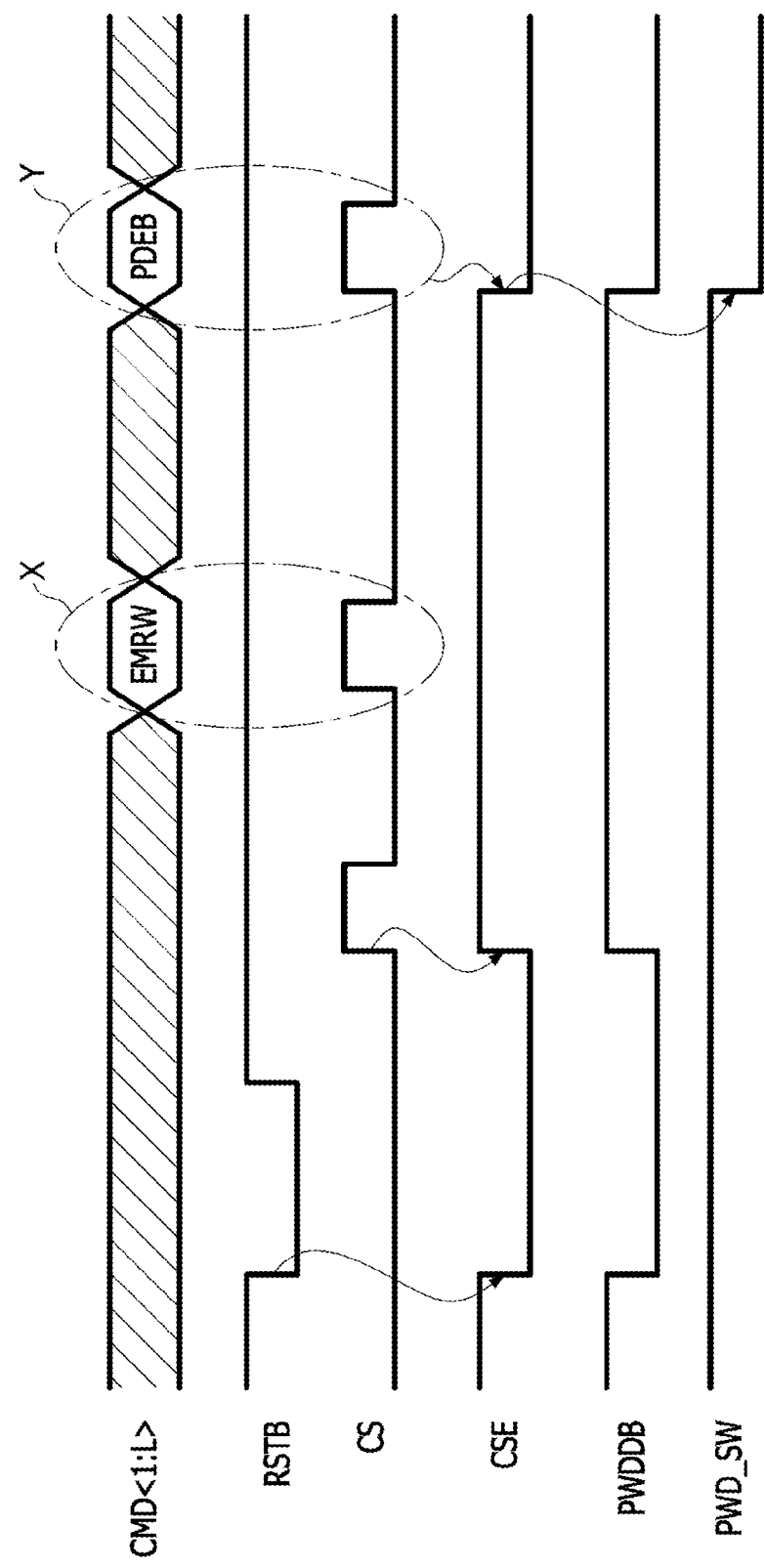
FIG. 8 is a timing diagram illustrating an operation of the semiconductor device illustrated in FIGS. 1 to 7.

FIG. 8 illustrates an operation for activating the power-down mode with the reset operation, an operation for exiting the power-down mode with the chip selection signal CS toggled after the reset operation terminates, and an operation for interrupting the supply of the power supply voltage VDD to the power line PSL with the power-down mode activating by the power-down command PDEB after the mode register write command EMRW is generated.

As illustrated in FIG. 8, if the reset operation is performed by the reset signal RSTB having a logic "low" level, the power-down mode may be activated to change a logic level of the operation period signal CSE from a logic "high" level into a logic "low" level. Since a logic level of the power-down control signal PWDDB is changed from a logic "high" level into a logic "low" level by the operation period signal CSE having a logic "low" level, an operation of the buffer circuit 15 may be inactivated. Although the operation period signal CSE has a logic "low" level according to the reset operation, the power switch control signal PWD_SW may maintain a logic "high" level. Thus, the power supply voltage VDD may be supplied to the logic circuit 52 through the power line PSL. Even though the semiconductor device 1 performs the reset operation to enter the power-down mode, the power supply voltage VDD may still be supplied to the logic circuit 52 to stably execute the reset operation in the logic circuit 52.

As illustrated in FIG. 8, if the chip selection signal CS is toggled after the reset signal RSTB is set to have a logic "high" level by termination of the reset operation, a logic level of the operation period signal CSE may be changed from a logic "low" level to a logic "high" level to put the semiconductor device 1 out of the power-down mode. Even though the chip selection signal CS is toggled after the power-down command PDEB is generated, a logic level of the operation period signal CSE may be changed from a logic "low" level to a logic "high" level to put the semiconductor device 1 out of the power-down mode. As a logic level of the power-down control signal PWDDB is changed from a logic "low" level into a logic "high" level by the operation period signal CSE having a logic "high" level, an operation of the buffer circuit 15 may be activated. In addition, since the power switch control signal PWD_SW maintains a logic "high" level, the power supply voltage VDD may be supplied to the logic circuit 52 through the power line PSL. The semiconductor device 1 according to an embodiment may stably enter the power-down mode if the reset signal RSTB or the power-down command PDEB is generated and may stably exit the power-down mode based on the chip selection signal CS which is toggled after the power-down command PDEB is generated.

As illustrated in FIG. 8, if the semiconductor device 1 enters the power-down mode by the power-down command PDEB ("Y") based on the chip selection signal CS after the mode register write command EMRW is generated based on the chip selection signal CS ("X"), a logic level of the operation period signal CSE is changed from a logic "high" level to a logic "low" level. The power switch control signal PWD_SW may be changed from the logic "high" level into the logic "low" level to interrupt the supply of the power supply voltage VDD to the logic circuit 52 through the power line PSL when the operation period signal CSE is changed from the logic "high" level to the logic "low" level. The semiconductor device 1 may supply the power supply voltage VDD to the logic circuit 52 until the semiconductor device 1 enters the power-down mode by the power-down command PDEB ("Y") after the mode register write command EMRW is generated ("X"). Thus, an enough period for performing the reset operation may be obtained.

The various operations of the semiconductor device 1 according to an embodiment will be sequentially described hereinafter with reference to FIG. 9 in conjunction with a power-down mode entry step (S1 of FIG. 9) executed by the reset operation, a power-down mode exit step (S2 of FIG. 9) executed after the reset operation, and a power supply interruption step (S3 of FIG. 9).

Now, the power-down mode entry step S1 will be described in detail hereinafter.

Figure 9:
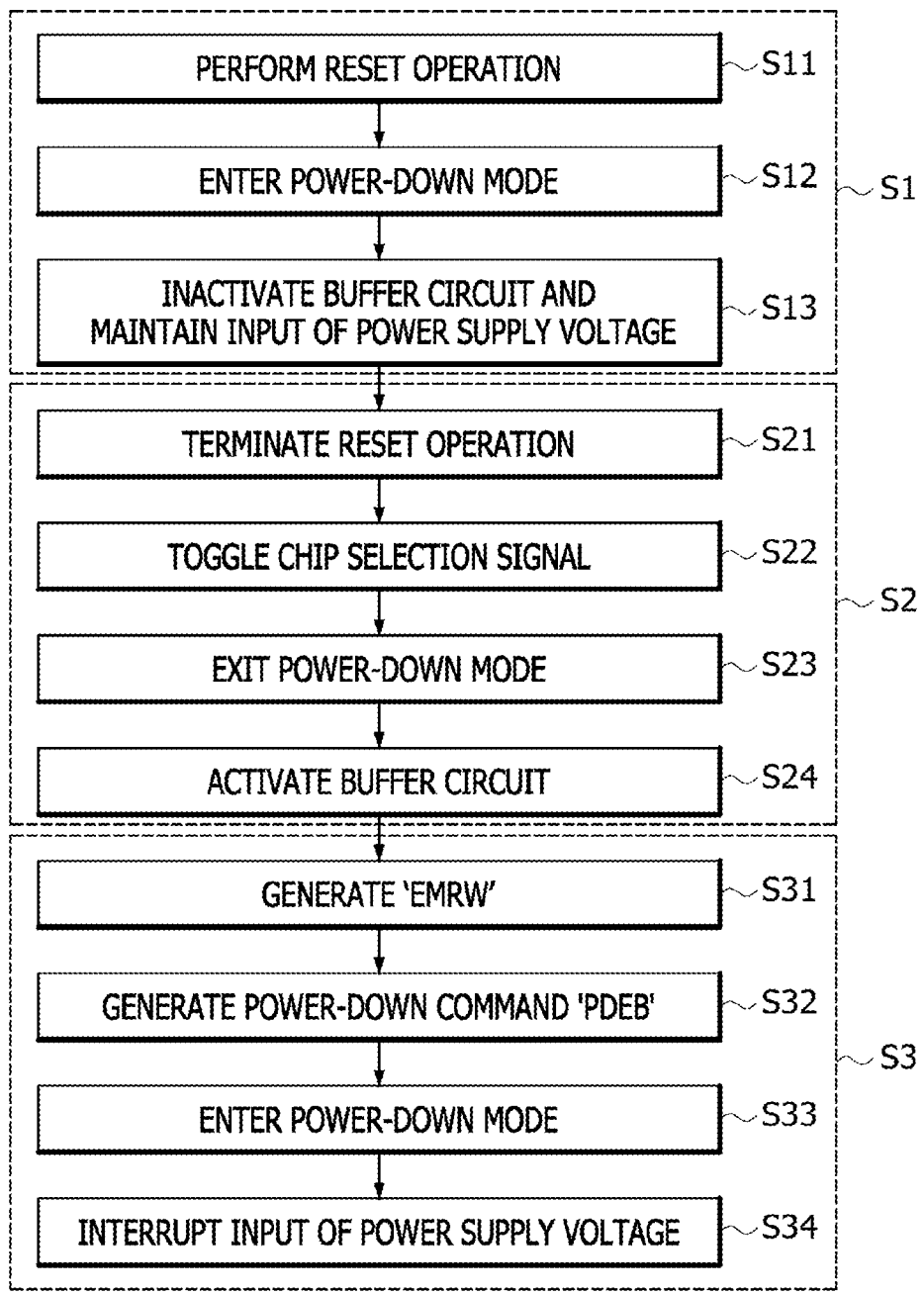
FIG. 9 is a flowchart illustrating an operation of the semiconductor device illustrated in FIGS. 1 to 7.

As illustrated in FIG. 9, if the reset operation is performed by the reset signal RSTB (see step S11), the power-down entry signal PD_ENT may be generated to put the semiconductor device 1 into the power-down mode (see step S12). In such a case, a logic level of the operation period signal CSE may be changed from a logic "high" level to a logic "low" level, and a logic level of the power-down control signal PWDDB may also be changed from a logic "high" level to a logic "low" level by the operation period signal CSE. Thus, an operation of the buffer circuit 15 may be inactivated, and the power supply voltage VDD may be supplied to the logic circuit 42 through the power line PSL by the power switch control signal PWD_SW maintaining a logic "high" level (see step S13).

Now, the power-down mode exit step S2 will be described in detail hereinafter.

As illustrated in FIG. 9, if the reset operation terminates (see step S21) and the chip selection signal CS is toggled (see step S22), a logic level of the operation period signal CSE may be changed from a logic "low" level to a logic "high" level to inactivate the power-down mode of the semiconductor device 1 (see step S23). In such a case, a logic level of the power-down control signal PWDDB may be changed from a logic "low" level to a logic "high" level by the operation period signal CSE to activate an operation of the buffer circuit 15 (see step S24).

Now, the power supply interruption step S3 will be described in detail hereinafter.

As illustrated in FIG. 9, if the mode register write command EMRW is generated (see step S31) and the power-down command PDEB is generated (see a step S32) to enter the power-down mode(see a step S33), a logic level of the power switch control signal PWD_SW may be changed from a logic "high" level to a logic "low" level to interrupt the supply of the power supply voltage VDD to the logic circuit 52 through the power line PSL (see step S34).

Figure 10:
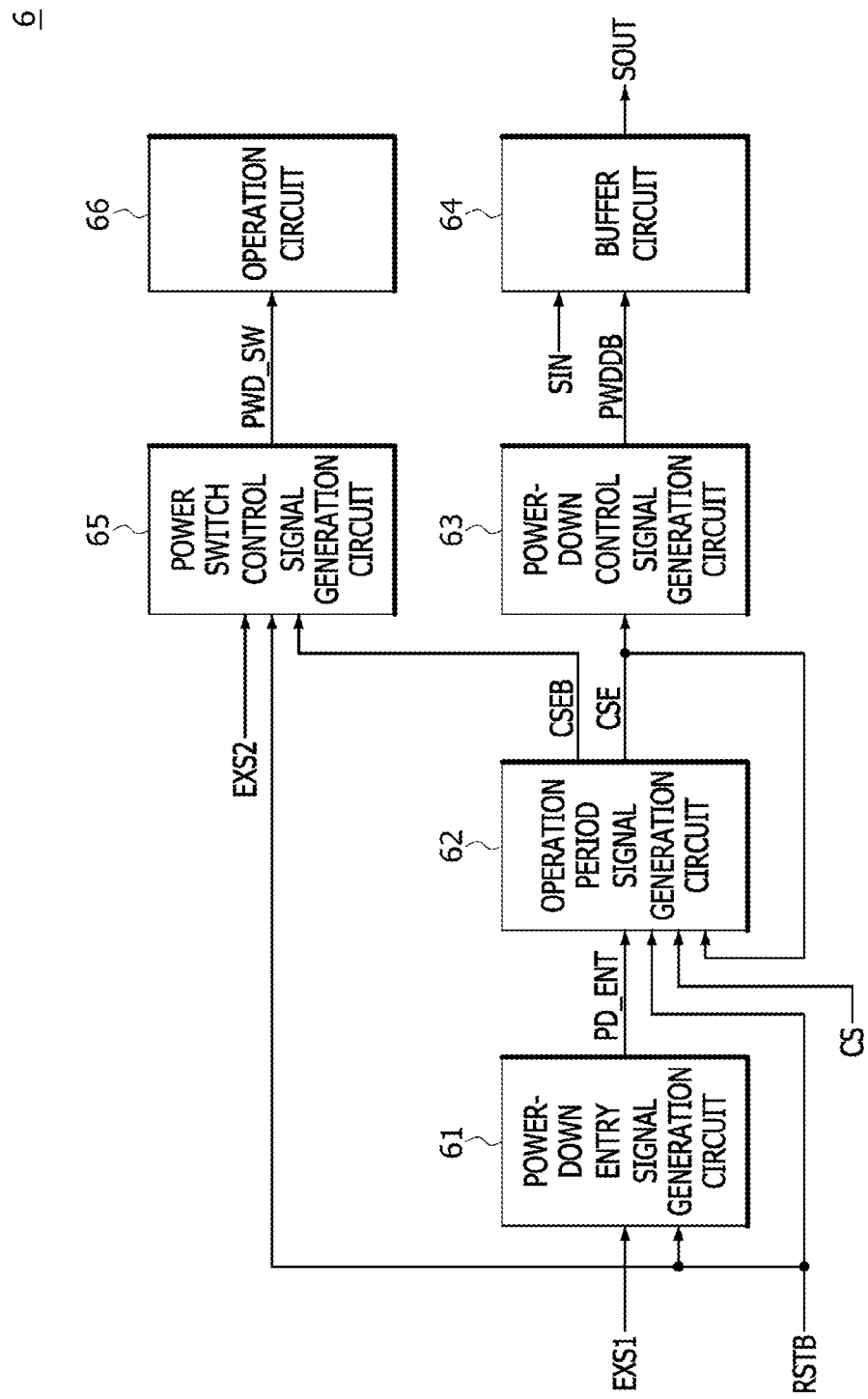
FIG. 10 is a block diagram illustrating a semiconductor device according to another embodiment of the present disclosure.

As illustrated in FIG. 10, a semiconductor device 6 according to another embodiment may include a power-down entry signal generation circuit 61, an operation period signal generation circuit 62, a power-down control signal generation circuit 63, a buffer circuit 64, a power switch control signal generation circuit 65, and an operation circuit 66.

The power-down entry signal generation circuit 61 may generate a power-down entry signal PD_ENT based on a first external control signal EXS1 and a reset signal RSTB. The power-down entry signal generation circuit 61 may generate the power-down entry signal PD_ENT if the first external control signal EXS1 is inputted to the power-down entry signal generation circuit 61 to activate a power-down mode or the reset signal RSTB is generated to perform a reset operation. The first external control signal EXS1 may be provided by an external device to put the semiconductor device 6 in the power-down mode. In some embodiments, the first external control signal EXS1 may be generated by a memory controller (1002 of FIG. 11) or a test apparatus (not illustrated). The reset operation may be performed to execute an initialization operation for setting logic levels of internal nodes in the semiconductor device 6 at an initial stage in which a power supply voltage VDD is firstly applied to the semiconductor device 6. The reset signal RSTB may be generated using different ways according to the embodiments. For example, the reset signal RSTB may be generated to include a pulse having a logic "low" level. The power-down entry signal PD_ENT may be generated for execution of the power-down mode or for execution of the reset operation. The power-down entry signal PD_ENT may be generated using different ways according to the embodiments. For example, the power-down entry signal PD_ENT may be generated to include a pulse having a logic "high" level.

The operation period signal generation circuit 62 may generate an operation period signal CSE and an inverted operation period signal CSEB based on the power-down entry signal PD_ENT, the reset signal RSTB, a chip selection signal CS, and the operation period signal CSE. The operation period signal generation circuit 62 may generate the operation period signal CSE having a first logic level if the power-down entry signal PD_ENT is generated to activate the power-down mode. The operation period signal generation circuit 62 may generate the operation period signal CSE having the first logic level and the inverted operation period signal CSEB having a second logic level if the reset signal RSTB is generated to perform the reset operation. The operation period signal generation circuit 62 may generate the operation period signal CSE having a second logic level and the inverted operation period signal CSEB having a first logic level if the chip selection signal CS is toggled to exit the power-down mode. In an embodiment, the operation period signal generation circuit 62 may generate the operation period signal CSE having a second logic level and the inverted operation period signal CSEB having a first logic level if the chip selection signal CS is toggled to exit the power-down mode after the reset signal is generated (e.g., after the reset operation is terminated). The chip selection signal CS may be provided by a memory controller (1002 of FIG. 11) which is separate from the semiconductor device 6. The chip selection signal CS may be generated if a chip including the semiconductor device 6 is selected. In an embodiment, the first logic level of the operation period signal CSE may be set as a logic "low" level, and the second logic level of the operation period signal CSE may be set as a logic "high" level. However, in some other embodiments, the first and second logic levels of the operation period signal CSE may be set differently.

The power-down control signal generation circuit 63 may buffer the operation period signal CSE to generate a power-down control signal PWDDB. The power-down control signal PWDDB may be generated to have the same logic level as the operation period signal CSE. In some embodiments, the power-down control signal PWDDB may be generated to have a logic level which is different from a logic level of the operation period signal CSE.

The buffer circuit 64 may buffer an input signal SIN based on the power-down control signal PWDDB to generate an output signal SOUT. The buffer circuit 64 may activate an operation that buffers the input signal SIN if the power-down control signal PWDDB has a second logic level. The buffer circuit 64 may inactivate the operation that buffers the input signal SIN if the power-down control signal PWDDB has a first logic level. In an embodiment, the first logic level of the power-down control signal PWDDB may be set as a logic "low" level, and the second logic level of the power-down control signal PWDDB may be set as a logic "high" level. However, in some other embodiments, the first and second logic levels of the power-down control signal PWDDB may be set differently.

The power switch control signal generation circuit 65 may generate a power switch control signal PWD_SW based on a second external control signal EXS2, the reset signal RSTB, and the inverted operation period signal CSEB. The second external control signal EXS2 may be provided by an external device which is separate from the semiconductor device 6. In some embodiments, the second external control signal EXS2 may be generated by the memory controller (1002 of FIG. 11) or the test apparatus (not illustrated). The power switch control signal generation circuit 65 may generate the power switch control signal PWD_SW having the second logic level to supply the power supply voltage VDD to a power line (PSL of FIG. 7) if the reset signal RSTB for performing the reset operation is generated. The power switch control signal generation circuit 65 may generate the power switch control signal PWD_SW having the first logic level to interrupt the supply of the power supply voltage VDD to the power line (PSL of FIG. 7) if the semiconductor device 6 enters the power-down mode by the first external control signal EXS1 inputted after the second external control signal EXS2 is inputted and the inverted operation period signal CSEB has the second logic level. The power switch control signal generation circuit 65 may generate the power switch control signal PWD_SW to supply the power supply voltage VDD to a power line (PSL of FIG. 7) if the reset signal RSTB for performing the reset operation is generated, and may generate the power switch control signal PWD_SW to interrupt the supply of the power supply voltage VDD to the power line (PSL of FIG. 7) if the semiconductor device 6 enters the power-down mode by the first external control signal EXS1 inputted after the second external control signal EXS2 is inputted. Thus, an enough period for performing the reset operation may be obtained.

The operation circuit 66 may control whether the power supply voltage VDD is supplied to a power line (PSL of FIG. 7), based on the power switch control signal PWD_SW. The operation circuit 66 may interrupt the supply of the power supply voltage VDD to the power line (PSL of FIG. 7), if the power switch control signal PWD_SW has the first logic level. The operation circuit 66 may supply the power supply voltage VDD to the power line (PSL of FIG. 7) if the power switch control signal PWD_SW has the second logic level.

According to the embodiments described above, even though a semiconductor device performs a reset operation to enter a power-down mode, a power supply voltage may still be supplied to a logic circuit of an operation circuit to stably execute the reset operation in the logic circuit.

In addition, the semiconductor device according to an embodiment may enter the power-down mode based on a command or a reset signal and may exit the power-down mode when a chip selection signal is toggled. Thus, the semiconductor device may stably enter or exit the power-down mode even without using any clock enablement signal.

Moreover, the semiconductor device according to an embodiment may interrupt the supply of a power supply voltage to the logic circuit of the operation circuit used in the reset operation, if the semiconductor device enters the power-down mode by a power-down command after a mode register write command is inputted. Thus, an enough period for performing the reset operation may be obtained.

Figure 11:
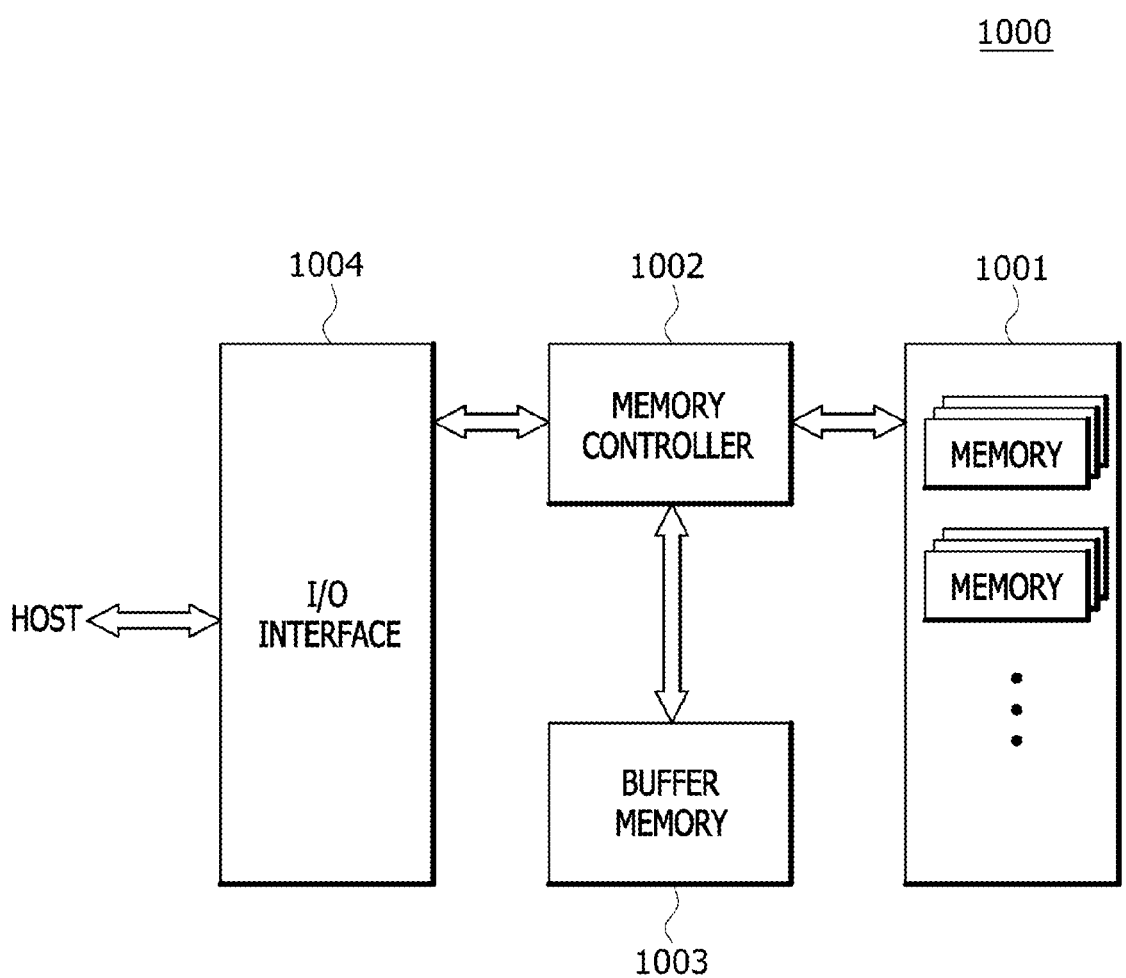
FIG. 11 is a block diagram illustrating a configuration of an electronic system employing at least one of the semiconductor devices illustrated in FIGS. 1 to 10.

At least one of the semiconductor devices described with reference to FIGS. 1 to 10 may be applied to an electronic system that includes a memory system, a graphic system, a computing system, a mobile system, or the like. For example, as illustrated in FIG. 11, an electronic system 1000 according an embodiment may include a data storage circuit

1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal outputted from the memory controller 1002. The data storage circuit 1001 may include at least one of the semiconductor devices 1 and 6 illustrated in FIGS. 1 and 10. Meanwhile, the data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 11 illustrates the memory controller 1002 with a single block, the memory controller 1002 may include one controller for controlling the data storage circuit 1001 and another controller for controlling the buffer memory 1003 comprised of a volatile memory.

The buffer memory 1003 may temporarily store the data to be processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read out the data stored therein and may output the data to the memory controller 1002. The buffer memory 1003 may include a volatile memory such as a dynamic random access memory (DRAM), a mobile DRAM, a static random access memory (SRAM), etc.

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data outputted from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI), an integrated drive electronics (IDE), etc.

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
an operation period signal generation circuit configured to generate an operation period signal based on a power-down entry signal and a reset signal; and
a power switch control signal generation circuit coupled to the operation period signal generation circuit, the power switch control signal generation circuit comprising:
a driver;
an output circuit; and
a latch coupled between the driver and the output circuit, the latch being configured to generate a power switch control signal for controlling supply of a power supply voltage to a logic circuit the logic circuit being configured to perform a reset operation responsive to the reset signal and the operation period signal when a power-down mode is activated.

2. The semiconductor device of claim 1,
wherein the power-down entry signal is generated when a power-down command is generated to activate the power-down mode or the reset signal is generated to perform the reset operation, and
wherein the reset operation activates the power-down mode.

3. The semiconductor device of claim 2, wherein the power-down command is generated by decoding a command.

4. The semiconductor device of claim 1, wherein the power-down entry signal is generated when an external control signal is inputted to the semiconductor device to activate the power-down mode.

5. The semiconductor device of claim 1, wherein the operation period signal generation circuit generates the operation period signal to exit the power-down mode when a level transition of a chip selection signal occurs.

6. The semiconductor device of claim 5,
wherein the operation period signal has a first logic level when the power-down entry signal is generated or the reset signal is generated; and
wherein the operation period signal has a second logic level when a level transition of the chip selection signal occurs after the reset signal is generated.

7. The semiconductor device of claim 1, wherein the mode register write command is generated by decoding a command.

8. The semiconductor device of claim 1, wherein the power switch control signal generation circuit generates the power switch control signal for interrupting supply of the power supply voltage when the semiconductor device enters the power-down mode after an external control signal is inputted.

9. The semiconductor device of claim 1, further comprising a power-down control signal generation circuit configured to generate a power-down control signal for inactivating a buffer circuit in the power-down mode and configured to generate the power-down control signal for activating the buffer circuit when the power-down mode terminates.

10. The semiconductor device of claim 1, wherein the power switch control signal generation circuit generates the power switch control signal for maintaining supply of the power supply voltage when the reset signal is generated to activate the power-down mode.

* * * * *